US012596144B2

(12) United States Patent
Ma et al.

(10) Patent No.: US 12,596,144 B2
(45) Date of Patent: Apr. 7, 2026

(54) METHOD AND SYSTEM FOR A PILOT DIRECTIONAL PROTECTION OF LCC-HVDC LINES BASED ON VIRTUAL GROUNDING RESISTANCE

(71) Applicant: NORTH CHINA ELECTRIC POWER UNIVERSITY, Beijing (CN)

(72) Inventors: Jing Ma, Beijing (CN); Wenyue Zhao, Beijing (CN); Zhencun Nie, Beijing (CN); Jialun Li, Beijing (CN); Yuchong Wu, Beijing (CN); Zengping Wang, Beijing (CN)

(73) Assignees: SHANGHAI UNIVERSITY OF ELECTRIC POWER, Shanghai (CN); STATE GRID SHANGHAI MUNICIPAL ELECTRIC POWER COMPANY, Shanghai (CN); NORTH CHINA ELECTRIC POWER UNIVERSITY, Beijing (CN)

( * ) Notice: Subject to any disclaimer, the term of this patent is extended or adjusted under 35 U.S.C. 154(b) by 648 days.

(21) Appl. No.: 18/065,956

(22) Filed: Dec. 14, 2022

(65) Prior Publication Data

US 2023/0341451 A1     Oct. 26, 2023

(30) Foreign Application Priority Data

Apr. 22, 2022     (CN) .......................... 202210426274.1

(51) Int. Cl.
| | |
|---|---|
| *G01R 31/08* | (2020.01) |
| *G01R 27/20* | (2006.01) |
| *G01R 31/52* | (2020.01) |
| *H02H 1/00* | (2006.01) |
| *H02H 7/26* | (2006.01) |
| *H02J 3/36* | (2006.01) |

(52) U.S. Cl.
CPC ........... *G01R 31/085* (2013.01); *G01R 27/20* (2013.01); *G01R 31/52* (2020.01); *H02H 1/0007* (2013.01); *H02H 7/268* (2013.01); *H02J 3/36* (2013.01)

(58) Field of Classification Search
CPC .. G01R 19/2513; G01R 27/20; G01R 31/085; G01R 31/52; H02H 1/0007; H02H 3/40; H02H 7/268; H02J 3/36
See application file for complete search history.

(56) References Cited

PUBLICATIONS

Yuan (CN 107677920)—English Translation (Year: 2018).*
Ma (CN 111769528)—English Translation (Year: 2020).*
Wang (CN 112363013)—English Translation (Year: 2021).*

* cited by examiner

*Primary Examiner* — Michael J Dalbo
(74) *Attorney, Agent, or Firm* — Syncoda LLC; Feng Ma

(57)     ABSTRACT

The application relates to a method and system for a pilot directional protection of LCC-HVDC lines based on virtual grounding resistance. The method comprises: Obtaining a conduction state information of a converter and characteristic parameters of a converter circuit within one commutation period after a fault occurs; according to the conduction state information and characteristic parameters, determining characteristic frequency of the circuit; according to the characteristic frequency and characteristic parameters, determining a virtual grounding resistance; according to the virtual grounding resistance, determining fault areas.

7 Claims, 9 Drawing Sheets

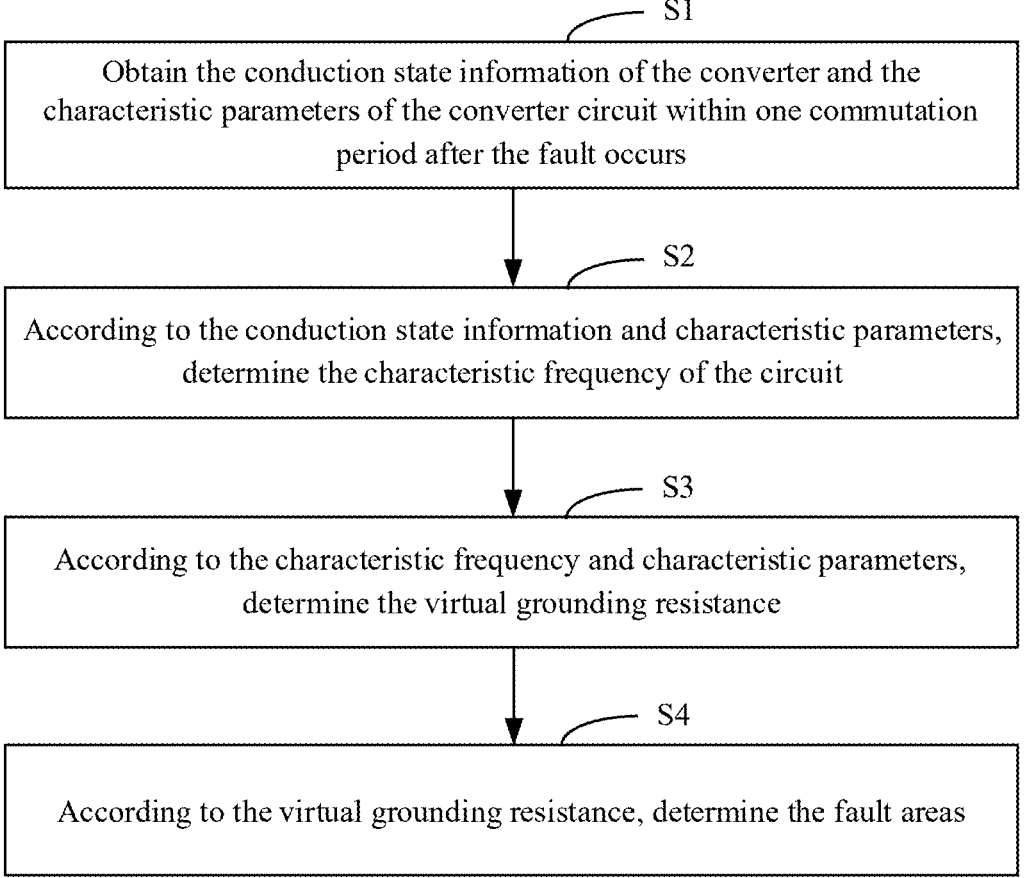

S1

Obtain the conduction state information of the converter and the characteristic parameters of the converter circuit within one commutation period after the fault occurs

S2

According to the conduction state information and characteristic parameters, determine the characteristic frequency of the circuit

S3

According to the characteristic frequency and characteristic parameters, determine the virtual grounding resistance

S4

According to the virtual grounding resistance, determine the fault areas

METHOD AND SYSTEM FOR A PILOT DIRECTIONAL PROTECTION OF LCC-HVDC LINES BASED ON VIRTUAL GROUNDING RESISTANCE

CROSS-REFERENCE TO RELATED APPLICATIONS

This application claims priority to Chinese Patent Application No. 2022104262741, filed on Apr. 22, 2022, which is hereby incorporated by reference in its entirety.

TECHNICAL FIELD

The application relates to the technical field of relay protection, and particularly relates to a method and system for a pilot directional protection of LCC-HVDC lines based on virtual grounding resistance.

BACKGROUND OF THE INVENTION

Currently, DC line protection mainly refers to traveling wave protection, differential under-voltage protection or pilot current differential protection.

Once the above three protection methods are used respectively, only the change of parameters in the DC system needs to be considered when a fault occurs. However, when a fault occurs and the converter is on, the DC line is bound to be affected by the AC system.

If the influence of the AC system is not considered, the existing protection methods have poor immunity to the fault resistance in internal fault cases, easily mal-operate in external fault cases, and easily be affected by changes in the operating conditions of the converter and the operating mode of the AC system.

SUMMARY OF THE INVENTION

In view of the above analysis, the application provides a method and system for a pilot directional protection of LCC-HVDC lines based on virtual grounding resistance, which may solve at least one of the above technical problems.

In one aspect, the application proposes a method for a pilot directional protection of LCC-HVDC lines based on virtual grounding resistance, comprises:

step S1: Obtaining a conduction state information of the converter and characteristic parameters of the converter circuit within one commutation period after the fault occurs in AC/DC hybrid system;

step S2: determining a characteristic frequency of the circuit according to the conduction state information and the characteristic parameters;

step S3: determining a virtual grounding resistance according to the characteristic frequency and the characteristic parameters;

step S4: determine fault areas according to the virtual grounding resistance.

Further, the converter is a 12-pulse converter, the converter has four conduction states, and each conduction state corresponds to one piece of conduction state information.

The characteristic parameters include converter characteristic parameters and circuit characteristic parameters.

The converter characteristic parameters include one or more of the three-phase voltage of the converter bus, the voltage of the preset node, the current of the converter transformer winding, and the transformation ratio of the converter transformer;

The circuit characteristic parameters include one or more of the structural parameters, current, voltage, inductance, equivalent inductance and equivalent resistance of each device in the circuit.

Further, determining the characteristic frequency of the circuit according to the conduction state information and the characteristic parameters, comprises:

determining the impedance of the converter in the conduction state according to the converter characteristic parameters corresponding to the conduction state and the circuit characteristic parameters;

determining the characteristic frequency band of the circuit according to the circuit characteristic parameters and the impedance of the converter in the conducting state;

determining the characteristic frequency of the circuit according to the characteristic frequency band of the circuit.

Further, determining the characteristic frequency band of the circuit according to the circuit characteristic parameters and the impedance of the converter in the conducting state, comprises:

according to the circuit characteristic parameters and the impedance of the converter in the conducting state, determining an impedance characteristic equation:

$$\mathrm{Im}[Z_{rec}] = \mathrm{Im}\big[(Z_{s1}//Z_{ac} + Z_d + Z_c)//Z_{dc}\big]$$

$$= \frac{a_{13}\omega^{13} + a_{11}\omega^{11} + \ldots + a_1\omega}{a_{12}\omega^{12} + a_{10}\omega^{10} + \ldots + a_0}$$

Where, $Z_{Rec}$ is the measured impedance of the DC line; $Z_s$ is the impedance of the AC system; $Z_{ac}$ and $Z_{dc}$ are the equivalent ground impedances of the AC filter and the DC filter, respectively; $Z_d$ is the equivalent impedance of the smoothing reactor; $Z_c$ is the equivalent impedance of the converter;

according to the impedance characteristic equation, constructing inductive characteristic frequency band and/or capacitive characteristic frequency band;

the inductive characteristic frequency band is specifically:

$$\omega_L = \left[ \begin{pmatrix} (0 < \omega < \omega_{1,1}) \cup (\omega_{1,2} < \omega < \omega_{1,3}) \\ \cup (\omega_{1,4} < \omega < \omega_{1,5}) \cup (\omega_{1,6} < \omega < +\infty) \end{pmatrix} \cap \\ \begin{pmatrix} (0 < \omega < \omega_{2,1}) \cup (\omega_{2,2} < \omega < \omega_{2,3}) \\ \cup (\omega_{2,4} < \omega < \omega_{2,5}) \cup (\omega_{2,6} < \omega < +\infty) \end{pmatrix} \right]$$

the capacitive characteristic frequency band is specifically:

$$\omega_C = \left[ \begin{pmatrix} (\omega_{1,1} < \omega < \omega_{1,2}) \cup (\omega_{1,3} < \omega < \omega_{1,4}) \\ \cup (\omega_{1,5} < \omega < \omega_{1,6}) \end{pmatrix} \cap \\ \begin{pmatrix} (\omega_{2,1} < \omega < \omega_{2,2}) \cup (\omega_{2,3} < \omega < \omega_{2,4}) \\ \cup (\omega_{2,5} < \omega < \omega_{2,6}) \end{pmatrix} \right]$$

Where, $\omega_{1,1}$, $\omega_{1,2}$, $\omega_{1,3}$, $\omega_{1,4}$, $\omega_{1,5}$ an $\omega_{1,6}$ are the solutions of $a_{13}\omega + A_{11}\omega^{11} + \ldots + a_1\omega = 0$; $\omega_{2,1}$, $\omega_{2,2}$, $\omega_{2,3}$, $\omega_{2,4}$, $\omega_{2,5}$ and $\omega_{2,6}$ are the solutions of $a_{12}\omega^{12} + a_{10}\omega^{10} + \ldots + a_0 = 0$.

Further, the characteristic frequency of the circuit is the smallest angular frequency and the second smallest angular frequency of the inductive characteristic frequency band of the converter;

Or, the characteristic frequency of the circuit is the smallest angular frequency and the second smallest angular frequency of the capacitive characteristic frequency band of the converter.

Further, determining the virtual grounding resistance according to the characteristic frequency and characteristic parameters, comprises:

constructing a virtual grounding resistance equation according to the characteristic parameters;

obtaining the virtual grounding resistance by solving the virtual grounding resistance equation according to the characteristic frequency.

Further, determining the fault are as according to the virtual grounding resistance, comprises:

determining the relationship between the virtual grounding resistance and the threshold value; if the virtual grounding resistance is less than the threshold value, it is determined that a fault occurs in the DC line area; otherwise, it is determined that a fault occurs outside the DC line area.

In another aspect, the application proposes a system for a pilot directional protection of LCC-HVDC lines based on virtual grounding resistance, comprising:

data acquisition module, configured to obtain conduction state information of the converter and characteristic parameters of the converter circuit within one commutation period after a fault occurs;

characteristic frequency calculation module, configured to determine a characteristic frequency of the circuit according to the conduction state information and the characteristic parameters;

data processing module, configured to determine a virtual grounding resistance according to the characteristic parameters and the characteristic frequency, and to determine fault are as according to the virtual grounding resistance.

Further, the converter is a 12-pulse converter, the converter has four conduction states, and each conduction state corresponds to one piece of conduction state information.

The characteristic parameters include converter characteristic parameters and circuit characteristic parameters.

The converter characteristic parameters include one or more of the three-phase voltage of the converter bus, the voltage of the preset node, the current of the converter transformer winding, and the transformation ratio of the converter transformer.

The circuit characteristic parameters include one or more of the structural parameters, current, voltage, inductance, equivalent inductance and equivalent resistance of each device in the circuit.

Further, the characteristic frequency calculation module is configured to determine the impedance of the converter in the conduction state according to the converter characteristic parameters corresponding to the conduction state and the circuit characteristic parameters; to determine the characteristic frequency band of the circuit according to the circuit characteristic parameters and the impedance of the converter in the conducting state; to determine the characteristic frequency of the circuit according to the characteristic frequency band of the circuit.

Compared with the prior art, the present application may achieve at least one of the following beneficial effects:

A. The existing DC transmission line protection technologies are mostly based on the law of sudden changes in the electrical quantity of the DC side fault for fault identification, and the protection value depends on experience, but there is a lack of fault modeling analysis for the DC line, its sending and receiving converters, and the AC system. In the present application, the characteristic frequency is determined based on the conduction state of the converter. And the characteristic frequency is used to characterize the influence of the AC line on the DC line, and to realize the quantification of the influence of the AC line on the DC line. Then according to the characteristic frequency, it is to determine the virtual resistance. That is to say, in a short period of time, the DC fault line and its sending and receiving converters and AC system will form a definite circuit topology structure, so as to realize the modeling of the DC line fault based on the circuit principle. To sum up, the application is to model based on the real circuit situation, so the judgment result has high reliability and sensitivity.

B. Since the existing modeling method relies on experience, it is only suitable for the case where the grounding resistance is 0 or close to 0. Once the grounding resistance exists and is relatively large, the sensitivity and accuracy of fault discrimination will fluctuate greatly. In the present application, the characteristic frequency of the circuit is determined based on the conduction state of the converter. Based on the measured impedance at the above characteristic frequencies, the virtual grounding resistance equation is solved, and the grounding resistance of the DC line during faults in the DC line is calculated by using the single-ended quantity information of different frequencies. To sum up, the present application performs fault judgment based on grounding resistance, so the judgment result has high reliability and sensitivity.

In the present application, the above technical schemes can also be combined with each other to realize more optimal combination schemes. Other characteristics and advantages of the present application will be described in a subsequent specification, and some of the advantages may become apparent from the specification or may be understood through the implementation of the present application. The purpose and other advantages of the application may be realized and obtained through the contents specifically indicated in the specification and the appended drawings.

BRIEF DESCRIPTION OF DRAWINGS

The attached figures are only for the purpose of illustrating specific embodiments, and are not considered to limit the present application. In the whole figures, the same reference symbols indicate the same components.

FIG. 1 is a flow chart of the method for a pilot directional protection of LCC-HVDC lines based on virtual grounding resistance;

DETAILED DESCRIPTION OF THE INVENTION

Figure 2:
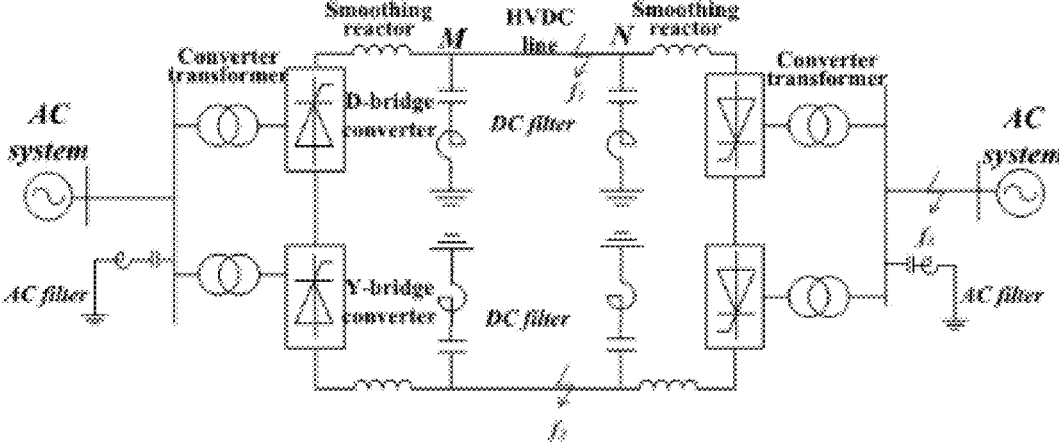
FIG. 2 is a schematic diagram of AC/DC hybrid system.

At The preferred embodiments of the application will be described below in combination with the attached figures in detail, where the attached figures form part of the application and, together with the embodiments of the application, are used to explain the principles of the application, not to define the scope of the application.

Currently, DC line protection methods mainly include traveling wave protection, differential under-voltage protection and pilot current differential protection. Traveling wave protection constructs protection criterion with the traveling waves of voltage and current in the initial fault stage, which exhibit obvious changes and are not affected by DC control. In engineering practice, the one-terminal protection method based on fault initial traveling waves is widely used as the primary protection for DC line. However, the traveling wave waveform is complex, and the data processing process takes a long time, so the protection action will be delayed. At the same time, the traveling wave protection does not consider the influence of the AC system on the DC line, which reduces the accuracy of determining the fault location. In addition, traveling wave protection needs to consider the influence of near-end metallic faults outside the area, resulting in a high setting value. When a high-resistance fault occurs in the area, the traveling wave protection cannot correctly and reliably identify the fault.

Differential under-voltage protection constructs its protection criterion by using the variation rate and amplitude drop of the post-fault voltage. It has higher selectivity and sensitivity than traveling wave protection. Differential under-voltage protection does not consider the influence of the AC system on the DC line, which reduces the accuracy of determining the fault location. The voltage change rate has a delay, which leads to a delay in the protection action. At the same time, it is difficult to solve the fault voltage and current by analytical methods, so that the protection setting value needs to be determined by the method of exhaustive simulation, thus increasing the amount of data processing. Even if the solution is solved after the failure occurs due to the formation of data, an erroneous protection action will occur. In addition, the differential under-voltage protection with standing transition resistance is still very limited.

Pilot current differential protection constitutes a protection scheme based on the summation of the currents at both ends of the DC line, and is used to remove the high-resistance faults that cannot be actuated by the traveling wave protection and differential under-voltage protection. The pilot current differential protection does not consider the influence of the AC system on the DC line, which reduces the accuracy of determining the fault location. In actual operation, the existence of the distributed capacitance of the DC line will cause the protection to malfunction under out-of-area faults or interference. In addition, the pilot current differential protection needs to exchange electrical quantity information at both ends, which requires higher communication channels and data synchronization.

Based on the above problems and scenarios, an embodiment of the present application provides a method for a pilot directional protection of LCC-HVDC lines based on virtual grounding resistance, as shown in FIG. 1, which includes the following steps:

step S1: obtain the conduction state information of the converter and the characteristic parameters of the converter circuit within one commutation period after the fault occurs.

In the embodiment of the present application, the converter is a 12-pulse converter, the 12-pulse converter has four conduction states, and each conduction state corresponds to one piece of conduction state information; the characteristic parameters include converter characteristic parameters and circuit characteristic parameters. The converter characteristic parameters include one or more of the three-phase voltage of the converter bus, the voltage of the preset node, the current of the converter transformer winding, and the transformation ratio of the converter transformer. The circuit characteristic parameters include one or more of the structural parameters, current, voltage, equivalent inductance and equivalent resistance of each device in the circuit. During actual use, if any one of the four converters in FIG. 2 is in a conducting state, the method in the embodiment of the present application can be implemented.

Figure 3:
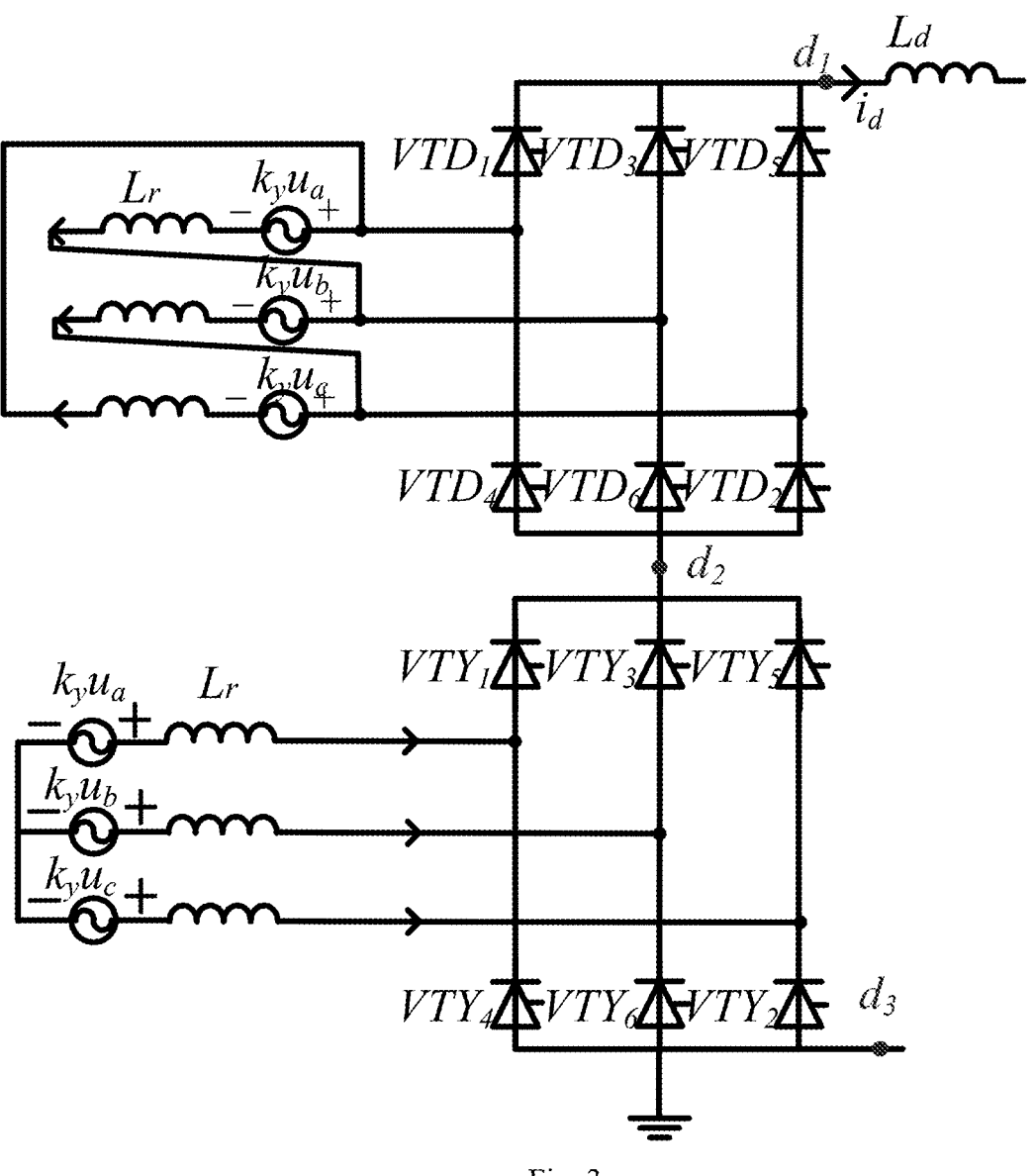
FIG. 3 is a wiring diagram of 12-pulse converter on the rectifier side.

The schematic diagram of AC/DC hybrid system of the embodiment of the present application is shown in FIG. 2, where MN is a DC transmission line, the circuit on the left side of node M is the rectifier side, and the circuit on the right side of node N is the inverter side. The rectifier side and the inverter side are respectively provided with two converters, an AC system, an AC filter, a smoothing reactor and a DC filter. The circuit structures on both sides are exactly the same, and the method of the present application can be implemented on either side. For convenience of description, the embodiment of the present application takes the rectifier side as an example for description. The wiring diagram of 12-pulse converter is shown in FIG. 3, including: a D-bridge converter and a Y-bridge converter.

The D-bridge converter includes converter valves VTD1-VTD6, three series branches are formed by VTD1 and VTD4, VTD3 and VTD6, and VTD5 and VTD2, the cathodes of VTD1, VTD3 and VTD5 are connected, and the anodes of VTD4, VTD6 and VTD2 are connected. The Y-bridge converter includes the converter valves VTY1-VTY6; three series branches are formed by VTY1 and VTY4, VTY3 and VTY6, and VTY5 and VTY2, the cathodes of VTY1, VTY3 and VTY5 are connected, and the anodes of VTY4, VTY6 and VTY2 are connected.

In the 12-pulse converter on the rectifier side, the conduction state of each valve can be divided into the following four types:

Conduction state 1: In the D-bridge converter, the two converter valves with adjacent numbers are turned on; in the Y-bridge converter, the two converter valves with the same numbers as the D-bridge converter are turned on. In particular, VTD1 and VTD2 are turned on, and VTY1 and VTY2 are turned on; or, VTD2 and VTD3 are turned on, and VTY2 and VTY3 are turned on; or, VTD3 and VTD4 are turned on, and VTY3 and VTY4 are turned on; or, VTD4 and VTD5 are turned on, and VTY4 and VTY5 are turned on; or, VTD5 and VTD6 are turned on, and VTY5 and VTY6 are turned on; or, VTD6 and VTD1 are turned on, and VTY6 and VTY1 are turned on. In this conduction state, the converter impedance is $Z_{cop1}$.

Conduction state 2: In the D-bridge converter, the two converter valves with adjacent numbers are turned on; in the Y-bridge converter, the three converter valves with adjacent numbers are turned on; and the numbers of the converter valves in the D-bridge are the same as the numbers of the first two converter valves in the Y-bridge converter. In particular, VTD1 and VTD2 are turned on, and VTY1, VTY2 and VTY3 are turned on; or, VTD2 and VTD3 are turned on, VTY2, VTY3 and VTY4 are turned on; or, VTD3 and VTD4 are turned on, and VTY3, VTY4 and VTY5 are turned on; or, VTD4 and VTD5 are turned on, and VTY4, VTY5, and VTY6 are turned on; or, VTD5 and VTD6 are turned on, VTY5, VTY6 and VTY1 are turned on; or, VTD6 and VTD1 are turned on, and VTY6, VTY1 and VTY2 are turned on. In this conduction state, the impedance of the converter is $Z_{cop2}$.

Conduction state 3: In the D-bridge converter, the two converter valves with adjacent numbers are turned on; in the Y-bridge converter, the two converter valves with adjacent numbers are turned on; and the number of the last converter valve in the D-bridge is the same as the number of the previous converter valve in the Y-bridge converter. Specifically, VTD1 and VTD2 are turned on, and VTY2 and VTY3 are turned on; or, VTD2 and VTD3 are turned on, and VTY3 and VTY4 are turned on; or, VTD3 and VTD4 are turned on, and VTY4 and VTY5 are turned on; or, VTD4 and VTD5 are turned on, and VTY5 and VTY6 are turned on; or, VTD5 and VTD6 are turned on, and VTY6 and VTY1 are turned on; or, VTD6 and VTD1 are turned on, and VTY1 and VTY2 are turned on. In this conduction state, the converter impedance is $Z_{cop3}$.

Conduction state 4: In the D-bridge inverter, the three converter valves with adjacent numbers are turned on; in the Y-bridge converter, the two converter valves with adjacent numbers are turned on; and the numbers of the converter valves in the Y-bridge are the same as the numbers of the last two converter valves in the D-bridge converter. Specifically, VTD1, VTD2, and VTD3 are turned on, and VTY2 and VTY3 are turned on; or, VTD2, VTD3, and VTD4 are turned on, and VTY3 and VTY4 are turned on; or, VTD3, VTD4, and VTD5 are turned on, and VTY4 and VTY5 are turned on; or, VTD4, VTD5, and VTD6 are turned on, and VTY5 and VTY6 are turned on; or, VTD5, VTD6 and VTD1 are turned on, and VTY6 and VTY1 are turned on; or, VTD6, VTD1 and VTD2 are turned on, and VTY1 and VTY2 are turned on. In this conduction state, the impedance of the converter is $Z_{cop4}$.

In the above conduction states, all other converter valves not described are closed. The information which represents the above conduction states is the conduction state information.

Figure 4:
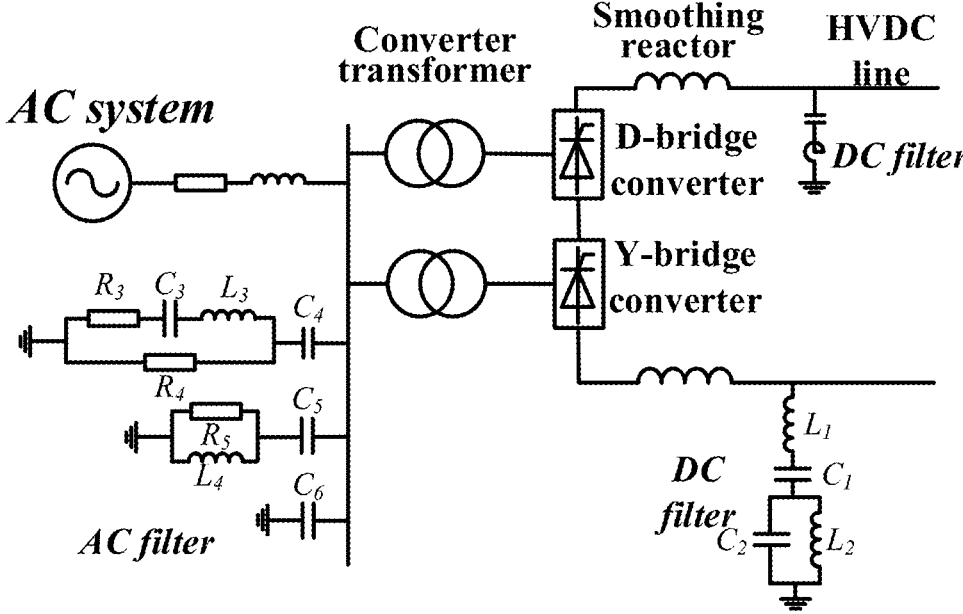
FIG. 4 is a network diagram of the AC/DC filter and the DC smoothing reactor.

The AC system, AC filter, smoothing reactor and DC filter on the rectifier side are shown in FIG. 4. Where, $C_1$, $C_2$, $L_1$ and $L_2$ are the structural parameters of the DC filter; $C_3$, $C_4$, $C_5$, $C_6$, $R_3$, $R_4$, $R_5$, $L_3$ and $L_4$ are the structural parameters of the AC filter; $R_{W1}$ and $L_{W1}$ are the equivalent resistance and the equivalent inductance of the AC system. The structural parameters are set when each component leaves the factory, so the parameters can be considered as fixed settings for each component. Among them, C represents capacitance, R represents resistance, and L represents inductance.

step S2: Determine the characteristic frequency of the circuit according to the conduction state information and the characteristic parameters.

In one embodiment of the present application, the specific process of step S2 is:

determine the impedance of the converter in the conduction state according to the converter characteristic parameters corresponding to the conduction state and the circuit characteristic parameter; determine the characteristic frequency band of the circuit according to the circuit characteristic parameters and the impedance of the converter in the conducting state; determine the characteristic frequency of the circuit according to the characteristic frequency band of the circuit.

Specifically, taking the Conduction state 2 of the rectifier side as an example, the following equations (1)-(8) can be written according to FIG. 3:

$$i_{ad} = i_{bd} \tag{1}$$

$$i_{cd} + i_d = i_{bd} \tag{2}$$

$$i_{ay} + i_{by} = i_d \tag{3}$$

$$i_{cy} = -i_d \tag{4}$$

$$u_d - L_r \frac{di_{cd}}{dt} + k_d u_c = u_{d1} \tag{5}$$

$$u_{d1} - L_r \frac{di_{ad}}{dt} - L_r \frac{di_{bd}}{dt} + k_d u_a + k_d u_b = u_d \tag{6}$$

$$u_{d2} - u_{d1} = k_y(u_c - u_a) - L_r \frac{di_{cy}}{dt} + L_r \frac{di_{by}}{dt} \tag{7}$$

$$u_{d2} - u_{d1} = k_y(u_c - u_a) - L_r \frac{di_{cy}}{dt} + L_r \frac{di_{by}}{dt} \tag{8}$$

Where, $u_a$, $u_b$ and $u_c$ are three-phase voltages at rectifier-side converter bus; $u_d$, $u_{d1}$ and $u_{d2}$ are the voltages at $d_1$, $d_2$ and $d_3$ in FIG. 3; $i_{ad}$, $i_{bd}$, $i_{cd}$, $i_{ay}$, $i_{by}$ and $i_{cy}$ are the windings currents of the converter transformer where the voltage sources $k_d u_a$, $k_d u_b$, $k_d u_c$, $k_y u_a$, $k_y u_b$, $k_y u_c$ are located, the positive direction is the associated reference direction of the above voltage sources; $k_d$ is the transformation ratios of Y/Δ converter transformers connecting with D-bridge converter, and $k_y$ is the transformation ratios of Y/Y converter transformers connecting with Y-bridge converter; $L_r$ is inductance of the converter transformer converted to the valve side; $L_d$ is inductance of the smoothing reactor; $i_d$ is the current flowing on the smoothing reactor.

In FIG. 2, three-phase voltages of the converter bus and three-phase currents of AC line L-K are:

$$\begin{cases} u_a = r_1 i_a + l_1 \dfrac{di_a}{dt} + e_{sa} \\ u_b = r_1 i_b + l_1 \dfrac{di_b}{dt} + e_{sb} \\ u_c = r_1 i_c + l_1 \dfrac{di_c}{dt} + e_{sc} \end{cases} \tag{9}$$

$$\begin{cases} i_a = -k_d i_{ad} - k_y i_{ay} + C_a \\ i_b = -k_d i_{bd} - k_y i_{by} + C_b \\ i_c = -k_d i_{cd} - k_y i_{cy} + C_c \end{cases} \tag{10}$$

Where, $l_1$ and $r_1$ are the positive-sequence inductance and resistance of AC line L-K; $e_{sa}$, $e_{sb}$ and $e_{sc}$ are the equivalent three-phase potential of AC system S1; $C_a$, $C_b$ and $C_c$ are three-phase currents flowing on the rectifier-side AC filter.

Combining equations (1)-(10), the impedance characteristic equation of the converter in Conduction state 2 is:

$$Z_{cop2} = j\frac{13}{6}\omega L_r$$

Where, $\omega$ is the angular frequency.

When the converter operates in the other conducting states, its impedance characteristic equation can be derived in the similar way, and the results are:

$$\begin{cases} Z_{cop1} = j\frac{8}{3}\omega L_r \\ Z_{cop3} = j\frac{8}{3}\omega L_r \\ Z_{cop4} = j\frac{5}{2}\omega L_r \end{cases}$$

Where, $Z_{cop1}$, $Z_{cop3}$ and $Z_{cop4}$ are the impedances of the converter in Conducting state 1, Conducting state 3 and Conducting state 4. In this way, the effect of the AC system on the virtual resistance can be added to the impedance characteristic equations.

According to FIG. 4, the impedance characteristic equations of DC filter, the smoothing reactor, rectifier-side AC system and AC filter can be written as:

$$Z_{dc} = j\left(\omega L_1 - \frac{1}{\omega C_1} + \frac{\omega L_2}{1 - \omega C_2 \omega L_2}\right) \tag{11}$$

$$Z_d = j\omega L_d \tag{12}$$

$$Z_{s1} = R_{W1} + j\omega L_{W1} \tag{13}$$

$$\begin{cases} Z_{ac} = Z_{ac1}//Z_{ac2}//z_{ac3} \\ Z_{ac1} = -j\frac{1}{\omega C_6} \\ Z_{ac2} = \frac{j\omega L_4 R_5}{R_5 + j\omega L_4} - j\frac{1}{\omega C_5} = \frac{\omega^2 R_5 L_4^2 + j\omega R_5^2 L_4}{R_5^2 + \omega^2 L_4^2} - j\frac{1}{\omega C_5} \\ Z_{ac3} = \dfrac{\left(R_3 + j\omega L_3 - j\dfrac{1}{\omega C_3}\right)R_4}{R_3 + j\omega L_3 - j\dfrac{1}{\omega C_3} + R_4} - j\dfrac{1}{\omega C_4} \end{cases} \tag{14}$$

Where, the symbol "//" represents the summation of parallel resistances.

When there is a fault on DC line, substitute the equivalent impedance $Z_{dc}$ of DC filter, the equivalent impedance $Z_d$ of DC smoothing reactor, the equivalent impedance $Z_{s1}$ of AC system, and the equivalent impedance $Z_{ac}$ of AC filter into the equivalent impedance $Z_{rec}$ of the backside system at the protection installation, and take its imaginary part, the numerator and denominator are arranges as polynomial about the frequency $\omega$, where $a_{13}$, $a_{12}$, $a_{11}$, $a_{10}$, $a_9$, $a_8$, $a_7$, $a_6$, $a_5$, $a_4$, $a_3$, $a_2$, $a_1$ and $a_0$ are preterm coefficients to the $0 \sim 13^{th}$ power of $\omega$ and are related to parameters of equations (10)-(13). The characteristic equation of the impedance on the rectifier side is:

$$Im[Z_{rec}] = Im\big[(Z_{s1}//Z_{ac} + Z_d + Z_c)//Z_{dc}\big]$$

$$= \frac{a_{13}\omega^{13} + a_{11}\omega^{11} + \ldots + a_1\omega}{a_{12}\omega^{12} + a_{10}\omega^{10} + \ldots + a_0}$$

According to the impedance characteristic equation, determine the inductive or the capacitive frequency band. The inductive frequency band is:

$$\omega_L = \left[\begin{array}{l} \left[\begin{array}{l} (0 < \omega < \omega_{1.1}) \cup (\omega_{1.2} < \omega < \omega_{1.3}) \\ \left(\bigcup (\omega_{1.4} < \omega < \omega_{1.5}) \cup (\omega_{1.6} < \omega < +\infty)\right) \end{array}\right] \cap \\ \left(\begin{array}{l} (0 < \omega < \omega_{2.1}) \cup (\omega_{2.2} < \omega < \omega_{2.3}) \\ \left(\bigcup (\omega_{2.4} < \omega < \omega_{2.5}) \cup (\omega_{2.6} < \omega < +\infty)\right) \end{array}\right) \end{array}\right]$$

The capacitive frequency band is:

$$\omega_C = \left[\begin{array}{l} \left[\begin{array}{l} (\omega_{1.1} < \omega < \omega_{1.2}) \cup (\omega_{1.3} < \omega < \omega_{1.4}) \\ \left(\bigcup (\omega_{1.5} < \omega < \omega_{1.6})\right) \end{array}\right] \cap \\ \left(\begin{array}{l} (\omega_{2.1} < \omega < \omega_{2.2}) \cup (\omega_{2.3} < \omega < \omega_{2.4}) \\ \left(\bigcup (\omega_{2.5} < \omega < \omega_{2.6})\right) \end{array}\right) \end{array}\right]$$

Where, $\omega_{1.1}$, $\omega_{1.2}$, $\omega_{1.3}$, $\omega_{1.4}$, $\omega_{1.5}$ and $\omega_{1.6}$ are the solutions of $a_3\omega^{13} + a_{11}\omega^{11} + \ldots + a_1\omega = 0$; $\omega_{2.1}$, $\omega_{2.2}$, $\omega_{2.3}$, $\omega_{2.4}$, $\omega_{2.5}$ and $\omega_{2.6}$ are the solutions of $a_{12}\omega^{12} + a_{10}\omega^{10} = \ldots + a_0 = 0$.

It is known that the characteristic harmonic angular frequency of the DC voltage in normal operation is 1200 $k\pi$rad/s ($k = 1, 2, \ldots$), so the characteristic frequency rang of the inductive frequency band is:

$$\omega_{hvdcL} = \omega_L \cap (\omega = 120k\pi)$$

the characteristic frequency rang of the capacitive frequency band is:

$$\omega_{hvdcC} = \omega_C \#(\omega = 1200k\pi)$$

In practical scenarios, either inductive or capacitive frequency bands can be used to determine the characteristic frequency of the circuit. Among them, the characteristic frequency of the circuit is the smallest angular frequency and the second smallest angular frequency of the inductive or capacitive frequency band of the rectifier side.

In normal operation, the right boundary of the characteristic harmonic interval of the DC line voltage in the inductive frequency band is $+\infty$ (positive infinity), while the characteristic harmonic interval in the capacitive frequency band is a finite interval, so the former can use more transient component information. Compared with the capacitive frequency band, the inductive frequency band is wider with more information of voltage and current available. In addition, because the transient component of the DC line voltage under fault conditions is greater than that during normal operation, priority should be given to ensure that there is sufficient transient component information to drive specific instances during normal operation of the DC line. The smallest and second-smallest angular frequencies $\omega_1$ and $\omega_2$ on the characteristic harmonic frequency band are used for the calculation of the protection action criterion.

step S3: Determine the virtual grounding resistance according to the characteristic frequency and characteristic parameters.

In the embodiment of the present application, the specific process of step S3 is:

construct a virtual grounding resistance equation according to the characteristic parameters; and obtain the virtual grounding resistance by solving the virtual grounding resistance equation according to the characteristic frequency.

Specifically, according to the model relationship between the internal and external faults in the system and the characteristic parameters, a virtual grounding resistance equation is:

$$\begin{cases} p_1 x^2 + p_2 x + p_3 R_{gM} x + p_4 = 0 \\ p_1 = [Z_{line}^2 - Z_{line} Z_{eq1}] \\ p_2 = -[Z_{rec2} Z_{line} + Z_{line}] \\ p_3 = -2 Z_{line} \\ p_4 = Z_{rec2}[Z_{line} + Z_{eq1}] \\ Z_{eq1} = Z_{dc}//[Z_d + Z_c + (Z_{ac}//Z_{s2})] \end{cases}$$

Where, $Z_{line}$ is the impedance of the DC line; $Z_{Rec2}$ is the measured impedance of the protection installation of the DC line; x is the percentage of the distance between the fault point and fault of the protection installation of the DC line; $R_{gM}$ is the virtual grounding resistance; $Z_{s2}$ is the impedance of the AC system on the inverter side. $Z_{ac}$ and $Z_{dc}$ are the equivalent ground impedance of the AC filter and the DC filter, respectively. $Z_d$ is the equivalent impedance of smoothing reactor. $Z_c$ is the equivalent impedance of converter.

Substituting the characteristic frequency $\omega_1$ and $\omega_2$ into the above equations:

$$p_{1(\omega_1)} x^2 + p_{2(\omega_1)} x + p_{3(\omega_1)} R_{gM} x + p_{4(\omega_1)} = 0 \qquad (15)$$

$$p_{1(\omega_2)} x^2 + p_{2(\omega_2)} x + p_{3(\omega_2)} R_{gM} x + p_{4(\omega_2)} = 0 \qquad (16)$$

Combining the equations (15) and (16):

$$x^2[p_{1(\omega_2)} p_{3(\omega_1)} - p_{3(\omega_2)} p_{1(\omega_1)}] + x[p_{3(\omega_1)} p_{2(\omega_2)} \\ - p_{3(\omega_2)} p_{2(\omega_1)}] + [p_{3(\omega_1)} p_{4(\omega_2)} - p_{3(\omega_2)} p_{4(\omega_1)}] = 0 \qquad (17)$$

According to equation (17), the only unknown quantity in the virtual grounding resistance equation is the fault location x. By performing nonlinear least squares estimation on the virtual grounding resistance equation, the fault location x can be obtained, and then the fault resistance $R_{gM}$ is calculated by applying the fault distance x to equations (15) or (16).

step S4: Determine the fault areas according to the virtual grounding resistance.

In the embodiment of the present application, the specific process of step S4 is:

Determine the relationship between the virtual grounding resistance and the threshold value; if the virtual grounding resistance is less than the threshold value, it is determined that a fault occurs in the DC line area; otherwise, it is determined that a fault occurs outside the DC line area.

Figure 5:
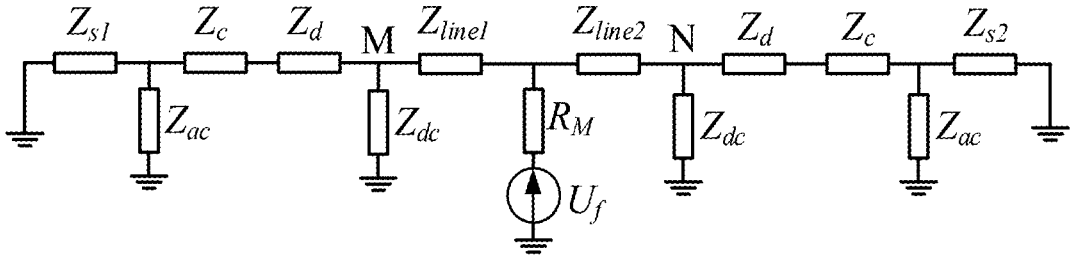
FIG. 5 is a fault component network in the case of internal fault.

The process of determining the threshold value is as follows:

When an internal fault occurs on the DC line, the fault component network of the AC/DC hybrid system can be constructed as that in FIG. 5. In FIG. 5, the point M is the rectifier-side DC bus, and the point N is the inverter-side DC bus. $Z_{line1}$ is the impedance of the line from the fault point to the pointM; $Z_{line2}$ is the impedance of the line from the fault point to the pointN; $Z_{s1}$ and $Z_{s2}$ is the impedance of rectifier-side AC system and converter-side AC system; $Z_{ac}$ and $Z_{dc}$ are the equivalent ground impedance of the AC filter and the DC filter, respectively; $Z_d$ is the equivalent impedance of smoothing reactor; $R_M$ is the transition impedance.

According to FIG. 5, the voltage and current at the pointM satisfy the following equations:

$$\begin{cases} Z_{rec2} = \dfrac{\Delta u_m}{\Delta i_m} \\ Z_{rec2} = Z_{line1} + R_M//\{Z_{line2} + Z_{eq1}\} \\ Z_{eq1} = Z_{dc}//[Z_d + Z_c + (Z_{ac}//Z_{s2})] \\ Z_{line1} = x Z_{line} \\ Z_{line2} = (1-x) Z_{line} \end{cases}$$

where $\Delta u_m$ and $\Delta i_m$ are the voltage and current at point M; $Z_{rec2}$ is the measured impedance at the protection installation of the DC line; $Z_{line}$ is the impedance of DC line; x is the percentage of the distance between the fault point and fault of the protection installation of the DC line.

Figure 6:
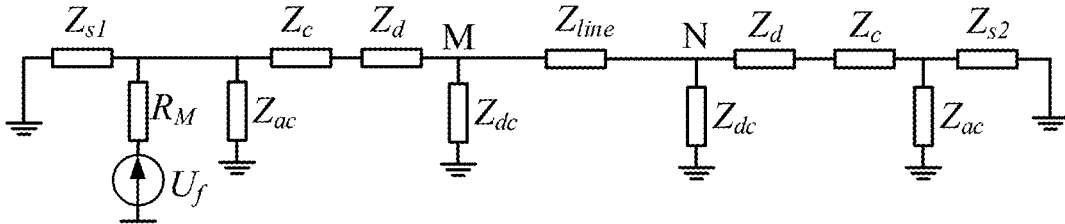
FIG. 6 is a fault component network in the case of external fault.

When an external fault occurs on the rectifier side of DC line, the fault component network of the AC/DC hybrid system can be constructed as that in FIG. 6.

According to FIG. 6, the voltage and current at point M satisfy the following equations:

$$\begin{cases} Z_{rec2} = \dfrac{\Delta u_m}{\Delta i_m} \\ Z_{rec2} = Z_{line1} + R_M//\{Z_{line2} + Z_{eq1}\} \\ Z_{eq1} = Z_{dc}//[Z_d + Z_c + (Z_{ac}//Z_{s2})] \end{cases}$$

where $R_M$ is a constant approaching $+\infty$, $\Delta u_m$ and $\Delta i_m$ are the voltage and current at point M; $Z_{rec2}$ is the measured impedance at the protection installation of the DC line; $Z_{line}$ is the impedance of DC line; x is the percentage of the distance between the fault point and fault of the protection installation of the DC line; $Z_{line1}$ is the impedance from the fault point to the protection installation on the rectifier side; $Z_{line2}$ is the impedance from the fault point to the protection installation on the inverter side; $Z_{S2}$ is the impedance of the AC system on the inverter side.

Since the virtual grounding resistance is equal to the transition resistance in numerical value, it can be seen from the combination of the two situations: in the case of internal fault, the grounding resistance is a limited value equal to the actual fault resistance, but it approaches $+\infty$ in the case of external fault. Based on the above analysis, the protection criterion can be constructed in the case of internal fault occurs in DC lines as follows:

$$\begin{cases} R_{gM} < R_{set} \\ R_{gN} < R_{set} \end{cases}$$

Where $R_{gM}$ is the grounding resistance calculated with the voltage and current at pointM; $R_{gN}$ is the grounding resistance calculated with the voltage and current at pointN; $R_{set}$ is the setting threshold value.

If the values of $R_{gM}$ and $R_{gN}$ are both smaller than the threshold value, it means an internal fault has occurred, and the protection will operate; otherwise, it means an external fault has occurred, and the protection will not operate.

The setting threshold value is affected by the maximum transition resistance of internal fault. Considering certain margin, the threshold value can be set as:

$$R_{set} = K_{rel} R_{max}$$

Where, $K_{rel}$ is the reliability coefficient, which applies the value of 1.5 considering the impact of noise interference, etc.; $R_{max}$ is the maximum transition resistance of internal fault. The reliability factor and the maximum transition resistance ensure that the internal fault will not be identified as the external fault, so as to avoid the malfunction of the protection circuit.

Figure 7:
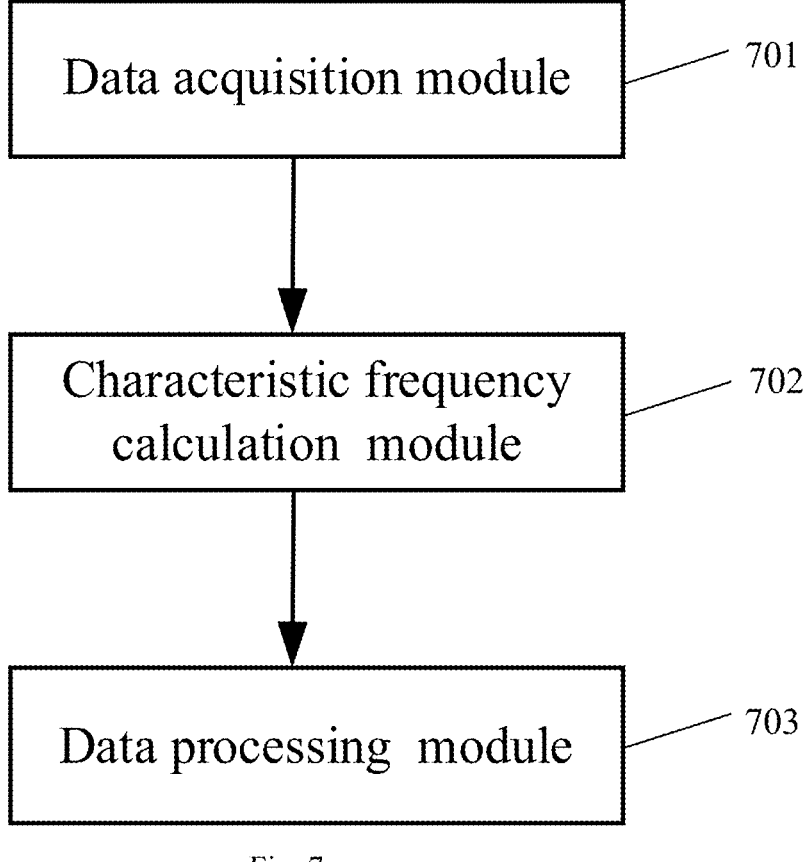
FIG. 7 is a schematic diagram of the system for a pilot directional protection of LCC-HVDC lines based on virtual grounding resistance.

As shown in FIG. 7, the embodiment of the present application provides a system for a pilot directional protection of LCC-HVDC lines based on virtual grounding resistance, including: data acquisition module 701, characteristic frequency calculation module 702, and data processing module 703. Wherein the data acquisition is implemented by sensors, for example, current sensor and voltage sensor, the characteristic frequency calculation is implemented by a first processor, and the data processing is implemented by a second processor. Each of the first processor and the second processor is independent processor, or both of them are integrated in a single processor.

Data acquisition module 701 is configured to obtain the conduction state information of the converter and the characteristic parameters of the converter circuit within one commutation period after the fault occurs;

Characteristic frequency calculation module 702 is configured to determine the characteristic frequency of the circuit according to the conduction state information and characteristic parameters;

Data processing module 703 is configured to determine the virtual grounding resistance according to the characteristic parameter and the characteristic frequency; and to determine the fault areas according to the virtual grounding resistance.

In the embodiment of the present application, the converter is a 12-pulse converter, the converter has four conduction states, and each conduction state corresponds to one piece of conduction state information;

The characteristic parameters include converter characteristic parameters and circuit characteristic parameters;

The converter characteristic parameters include one or more of the three-phase voltage of the converter bus, the voltage of the preset node, the current of the converter transformer winding, and the transformation ratio of the converter transformer;

The circuit characteristic parameters include one or more of the structural parameters, current, voltage, inductance, equivalent inductance and equivalent resistance of each device in the circuit.

In the embodiment of the present application, the characteristic frequency calculation module 702 is used to determine the impedance of the converter in the conduction state according to the converter characteristic parameters corresponding to the conduction state and the circuit characteristic parameters; to determine the characteristic frequency band of the circuit according to the circuit characteristic parameters and the impedance of the converter in the conducting state; and to determine the characteristic frequency of the circuit according to the characteristic frequency band of the circuit.

In order to verify the correctness and effectiveness of this method, in this embodiment, the AC/DC hybrid system built in this embodiment is shown in FIG. 2, and the main parameters of AC/DC hybrid system are shown in Table 1, take the time of failure to be zero time.

TABLE 1

| Main Parameters of AC/DC Hybrid System | |
|---|---|
| Parameter | Value |
| Rectifier-side converter transformer capacity | 598 MVA |
| Rectifier-side converter transformer ratio | 450 kV/200.6 kV |
| Rectifier-side converter transformer impedance percentage | 16% |
| Inverter-side converter transformer capacity | 598 MVA |
| Inverter-side converter transformer ratio | 331.2 kV/200.6 kV |
| Inverter-side converter transformer impedance percentage | 16% |
| Inductance of Smoothing Reactor | 290 mH |
| Positive-sequence resistance of AC line M-N | 0.021602/km |
| Positive -sequence reactance of AC line M-N | 0.275002/km |
| Zero-sequence resistance of AC line M-N | 0.167202/km |
| Zero-sequence reactance of AC line M-N | 0.62552/km |

Substituting the parameters of each element in Table 1 into the impedance characteristic equation of the rectifier side, it can be calculated that the minimum angular frequency of the inductive system is $1200\pi$ rad/s, so $\omega_1$ can be taken as $1200\pi$ rad/s, and $\omega_2$ can be taken as $2400\pi$ rad/s.

There are three cases in this embodiment:

Case 1: Simulate internal faults with different fault resistances at 50% line length on the positive-pole DC line with the fault resistance ranging between 0-300$\Omega$. $R_{gM}$ and $R_{gN}$ can be calculated as shown in FIGS. 8 and 9.

Figure 8:
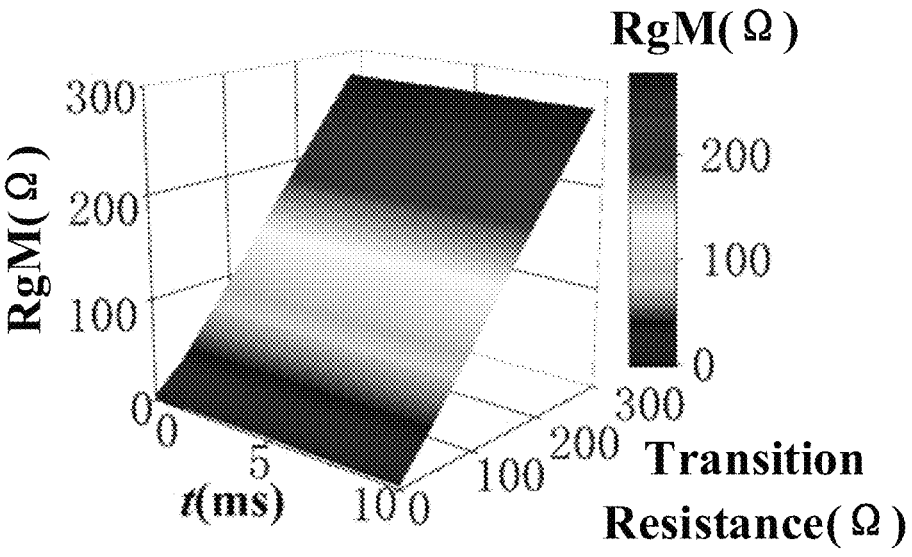
FIG. 8 is a simulation result of $R_{gM}$ for internal faults with different fault resistances.
Figure 9:
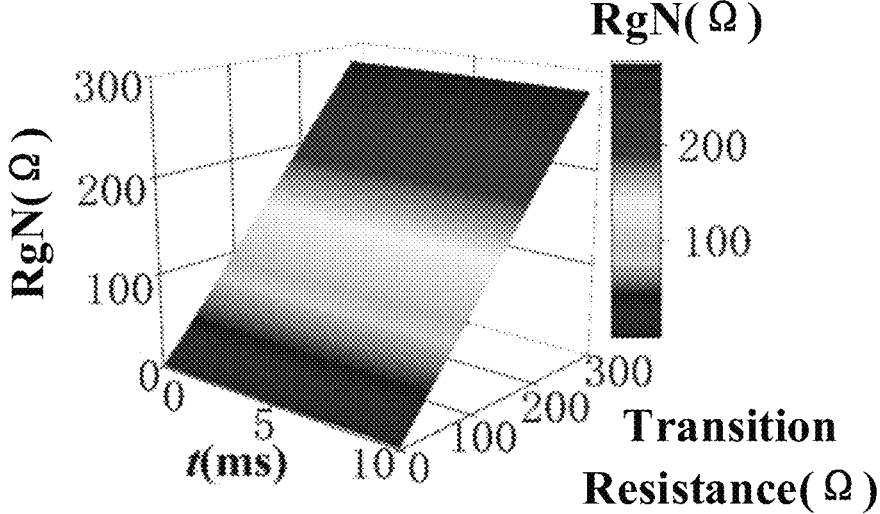
FIG. 9 is a simulation result of $R_{gN}$ for internal faults with different fault resistances.

In FIGS. 8 and 9, the time axis, the actual transition resistance and the grounding resistance form a plane with a tilt of 45°, which means that the actual transition resistance and the grounding resistance remain consistent at various time sections. Besides, the relative error rises first and then drops with the actual transition resistance increasing. The relative error of $R_{gM}$ reach maximum 2.85% at t=9.9 ms, when the actual fault resistance is 40$\Omega$; the relative error of $R_{gN}$ reach maximum 2.25% at t=9.7 ms, when the actual fault resistance is 200$\Omega$.

In FIGS. 8 and 9, with the increase of transition resistance, $R_{gM}$ and $R_{gN}$ at the same time section both increase. According to the values of $R_{gM}$ and $R_{gN}$ under different fault and protection criterion, an internal fault in DC line can be identified. Seen from FIG. 8, when the fault occurs in DC line and the transition resistance is 300$\Omega$, $R_{gM}$ has the maximum value 298.44 at t=0.5 ms. Seen from FIG. 9, when the transition resistance is 300$\Omega$, $R_{gN}$ has the maximum value 304.21 at t=0.2 ms, both far below the threshold value. Therefore, it proves that the proposed method is sensitive to high-resistance internal faults in DC lines.

Case 2: Simulate internal faults at different locations of the negative-pole DC line from pointM by the transition resistance of 300$\Omega$. $R_{gM}$ and $R_{gN}$ can be calculated as shown in FIGS. 10 and 11.

Figure 10:
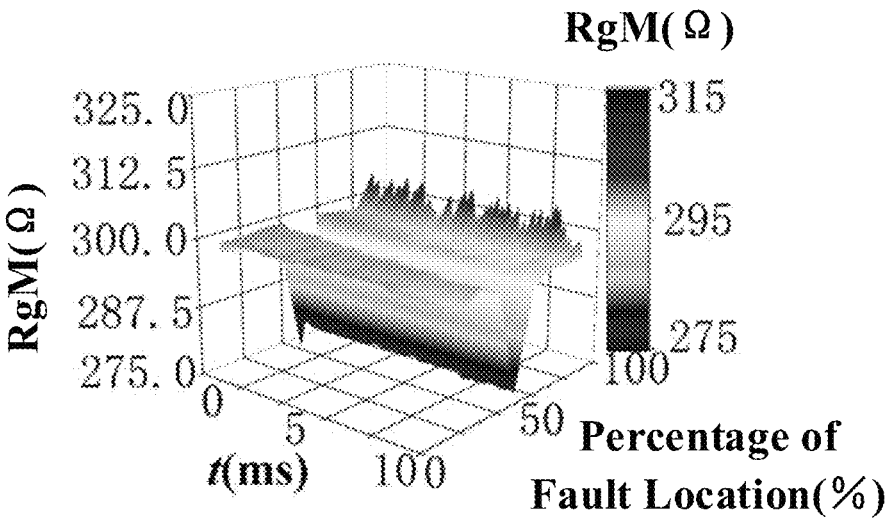
FIG. 10 is a simulation result of $R_{gM}$ for internal faults at different locations.
Figure 11:
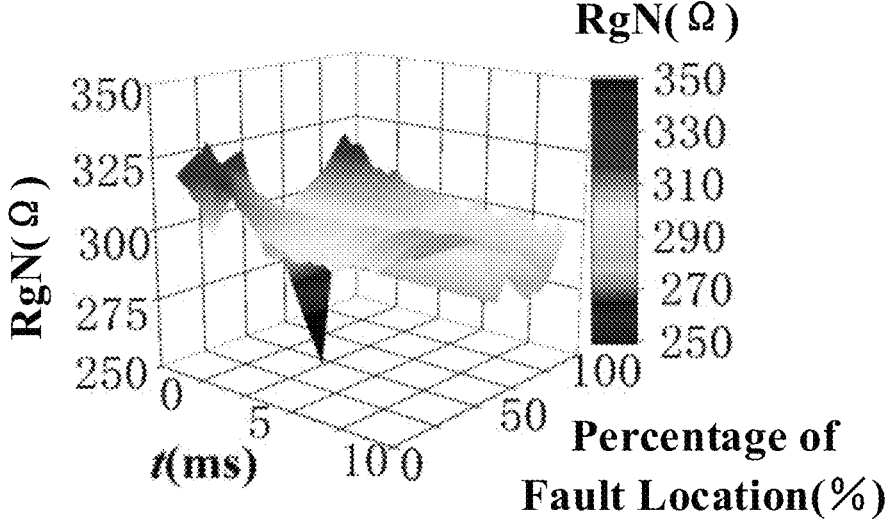
FIG. 11 is a simulation result of $R_{gN}$ for internal faults at different locations.

In FIGS. 10 and 11, the values of $R_{gM}$ and $R_{gN}$ both have some slight fluctuations at the same time section. With the values of $R_{gM}$ and $R_{gN}$ at different locations and protection criterion, an internal negative-pole fault in DC lines can be identified. $R_{gM}$ has the maximum value 298.88 at t=0.5 ms, as the fault is set at 60% line length from pointM; $R_{gN}$ has the maximum value 343.08 at t=0.1 ms, as the fault is set at 20% line length from pointM. Both values are under the threshold value. Thus, the proposed protection criterion is not affected by the fault locations, and it is sensitive even to high-resistance faults occurring at the end of DC line.

Case 3: Simulate phase A-to-ground fault at $f_1$ in FIG. 2 with transition resistance ranging between 0~300Ω. At t=0 ms, $VTY_1$, $VTY_2$, $VTD_1$ and $VTD_2$ are turned on. As the triggering signals of $VTY_3$ and $VTD_3$ arrive, Y/D-bridge converters commutate successively. When the voltage on $VTD_1$ becomes positive firstly, the conducting states of Y/D-bridge converters are shown in Table 2.

TABLE 2

| Converter conduction state when A-phase ground fault occurs at $f_1$ | | | |
|---|---|---|---|
| Transition resistance (Ω) | Conducted valves in Y-bridge converter | Conducted valves in D-bridge converter | Does the commutation fail? |
| 0 | VTY1, VTY2 | VTD2, VTD3 | Yes |
| 50 | VTY2, VTY3 | VTD2, VTD3 | No |
| 100 | VTY2, VTY3 | VTD2, VTD3 | No |
| 150 | VTY2, VTY3 | VTD2, VTD3 | No |
| 200 | VTY2, VTY3 | VTD2, VTD3 | No |
| 250 | VTY2, VTY3 | VTD2, VTD3 | No |
| 300 | VTY2, VTY3 | VTD2, VTD3 | No |

According to Table 2, $VTY_1$ fails to recover the blocking ability during reverse voltage with the transition resistance of 0Ω, Y-bridge converter fails to commutate regularly. As the transition resistance ranging between 50Ω~300Ω, the conducting states of Y/D-bridge converters are in consistence with the normal one, i.e. Y-bridge and D-bridge converters are in normal commutation. In this fault case, $R_{gM}$ and $R_{gN}$ can be calculated as shown in FIGS. 12 and 13.

Figure 12:
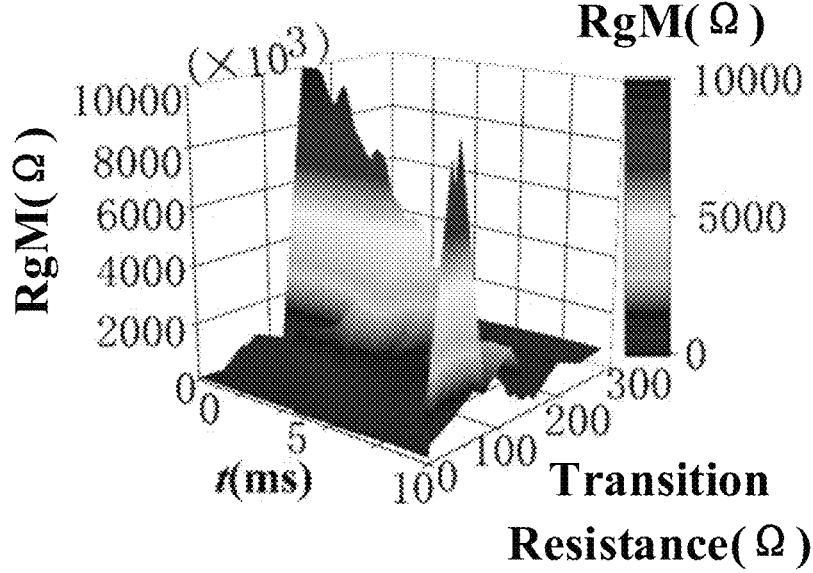
FIG. 12 is a simulation result of $R_{gM}$ for external faults with different fault resistances.
Figure 13:
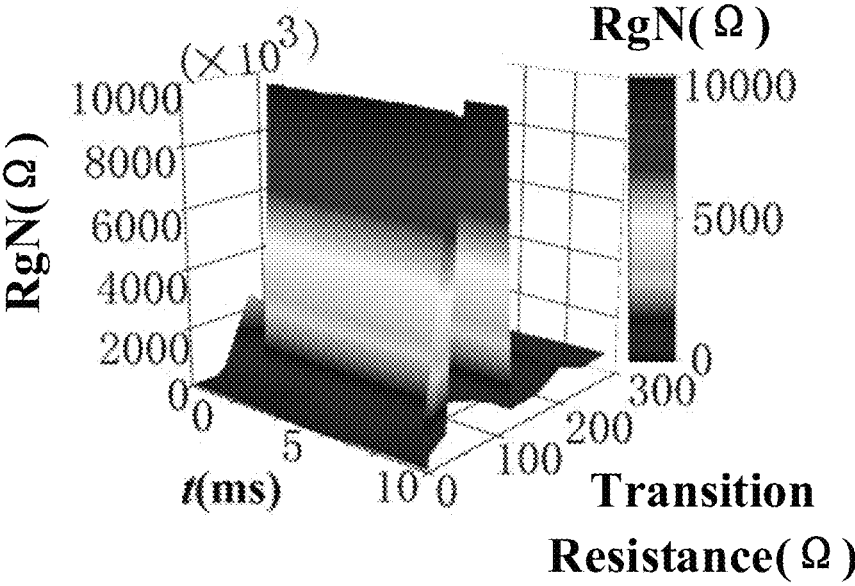
FIG. 13 is a simulation result of $R_{gN}$ for external faults with different fault resistances.

In FIGS. 12 and 13, the grounding resistance at different time sections rises first and then drops with the transition resistance increasing. However, it is still above the threshold value. As shown in FIG. 12, $R_{gM}$ has the minimum value 4782.18 at t=0.4 ms, as the transition resistance is 40Ω. Seen from FIG. 13, $R_{gN}$ has the minimum value 2643.99 at t=3 ms, as the transition resistance is 300Ω. Since $R_{gM}$ and $R_{gN}$ are both far above the threshold value 1500Ω, an external fault in DC lines can be identified, that is to say, no fault occurs between point M and point N, so the protection does not operate.

If a synchronization error happens between the data of inverter-side and the data of rectifier-side, according to protection criterion, $R_{gN}$ is always over the threshold value, a backward fault in DC lines can be identified. Since the post-fault current turn-off and system restarting are both done in the rectifier station, the fault direction identification result of inverter sides can be transmitted to the rectifier side. Thus, the external fault can be determined. Hence, the data synchronization error and commutation failure have no effect on the proposed scheme.

A non-transitory machine-readable storage medium comprising instructions that when executed cause a processor of a computing device to obtain a conduction state information of a converter and characteristic parameters of a converter circuit within one commutation period after a fault occurs in AC/DC hybrid system; determine a characteristic frequency of the circuit according to the conduction state information and the characteristic parameters; determine a virtual grounding resistance according to the characteristic frequency and the characteristic parameters; determine fault areas according to the virtual grounding resistance.

The above are only preferred specific embodiments of the present application, but the scope of protection of the present application is not limited to this, any person skilled in the art can easily think of changes or replacement changes within the technical scope disclosed by the present application should be covered within the protection scope of the present application.

The invention claimed is:

1. A method for a pilot directional protection of LCC-HVDC lines based on virtual grounding resistance, comprising:

Obtaining a conduction state information of a converter and characteristic parameters of a converter circuit within one commutation period after a fault occurs in AC/DC hybrid system;

determining a characteristic frequency of the circuit according to the conduction state information and the characteristic parameters;

determining a virtual grounding resistance according to the characteristic frequency and the characteristic parameters;

determining fault areas according to the virtual grounding resistance;

protecting the LCC-HVDC lines based on the fault areas, turning off current in the LCC-HVDC lines when the fault areas are located within the LCC-HVDC lines.

2. The method for a pilot directional protection of LCC-HVDC lines based on virtual grounding resistance according to claim 1, wherein the converter is a 12-pulse converter and has four conduction states, and each of the conduction states corresponds to one piece of conduction state information;

the characteristic parameters include converter characteristic parameters and circuit characteristic parameters;

the converter characteristic parameters include one or more of three-phase voltage of a converter bus, voltage of a preset node, current of a converter transformer winding, and transformation ratio of a converter transformer;

the circuit characteristic parameters include one or more of structural parameters, current, voltage, inductance, equivalent inductance and equivalent resistance of each device in the circuit.

3. The method for a pilot directional protection of LCC-HVDC lines based on virtual grounding resistance according to claim 2, wherein determining the characteristic frequency of the circuit according to the conduction state information and characteristic parameters, comprises:

determining an impedance of the converter in the conduction state according to the converter characteristic parameters corresponding to the conduction state and the circuit characteristic parameters;

determining a characteristic frequency band of the circuit according to the circuit characteristic parameters and the impedance of the converter in the conducting state;

determining characteristic frequency of the circuit according to the characteristic frequency band of the circuit.

4. The method for a pilot directional protection of LCC-HVDC lines based on virtual grounding resistance according to claim 3, wherein determining the characteristic frequency band of the circuit according to the circuit characteristic parameters and the impedance of the converter in the conducting state, comprises:

determining an impedance characteristic equation according to the circuit characteristic parameters and the impedance of the converter in the conducting state:

$$Im[Z_{rec}] = Im\left[(Z_{s1}//Z_{ac} + Z_d + Z_c)//Z_{dc}\right]$$

$$= \frac{a_{13}\omega^{13} + a_{11}\omega^{11} + \ldots + a_1\omega}{a_{12}\omega^{12} + a_{10}\omega^{10} + \ldots + a_0}$$

$$Im[Z_{rec}] = Im\left[(Z_s//Z_{ac} + Z_d + Z_c)//Z_{dc}\right]$$

$$= \frac{a_{13}\omega^{13} + a_{11}\omega^{11} + \ldots + a_1\omega}{a_{12}\omega^{12} + a_{10}\omega^{10} + \ldots + a_0}$$

Where, $Z_{rec}$ is the measured impedance of the DC line; $Z_s$ is the impedance of the AC system; $Z_{ac}$ and $Z_{dc}$ are the equivalent ground impedances of the AC filter and the DC filter, respectively; $Z_d$ is the equivalent impedance of the smoothing reactor; $Z_c$ is the equivalent impedance of the converter;

Constructing an inductive characteristic frequency or a capacitive characteristic frequency band according to the impedance characteristic equation;

the inductive characteristic frequency band is specifically:

$$\omega_L = \begin{bmatrix} \left( \begin{array}{c} (0 < \omega < \omega_{1.1}) \cup (\omega_{1.2} < \omega < \omega_{1.3}) \\ \cup (\omega_{1.4} < \omega < \omega_{1.5}) \cup (\omega_{1.6} < \omega < +\infty) \end{array} \right) \cap \\ \left( \begin{array}{c} (0 < \omega < \omega_{2.1}) \cup (\omega_{2.2} < \omega < \omega_{2.3}) \\ \cup (\omega_{2.4} < \omega < \omega_{2.5}) \cup (\omega_{2.6} < \omega < +\infty) \end{array} \right) \end{bmatrix}$$

the capacitive characteristic frequency band is specifically:

$$\omega_C = \begin{bmatrix} \left( \begin{array}{c} (\omega_{1.1} < \omega < \omega_{1.2}) \cup (\omega_{1.3} < \omega < \omega_{1.4}) \\ \cup (\omega_{1.5} < \omega < \omega_{1.6}) \end{array} \right) \cap \\ \left( \begin{array}{c} (\omega_{2.1} < \omega < \omega_{2.2}) \cup (\omega_{2.3} < \omega < \omega_{2.4}) \\ \cup (\omega_{2.5} < \omega < \omega_{2.6}) \end{array} \right) \end{bmatrix}$$

Where, $\omega_{1.1}$, $\omega_{1.2}$, $\omega_{1.3}$, $\omega_{1.4}$, $\omega_{1.5}$ and $\omega_{1.6}$ are the solutions of $a_{13}\omega^{13} + a_{11}\omega^{11} + \ldots + a_1\omega = 0$; $\omega_{2.1}$, $\omega_{2.2}$, $\omega_{2.3}$, $\omega_{2.4}$, $\omega_{2.5}$ and $\omega_{2.6}$ are the solutions of $a_{12}\omega^{12} + a_{10}\omega^{10} + \ldots + a_0 = 0$.

5. The method for a pilot directional protection of LCC-HVDC lines based on virtual grounding resistance according to claim 1, wherein the characteristic frequency of the circuit is the smallest angular frequency and the second smallest angular frequency of the inductive or the capacitive characteristic frequency band of the converter.

6. The method for a pilot directional protection of LCC-HVDC lines based on virtual grounding resistance according to claim 1, wherein determining the virtual grounding resistance according to the characteristic frequency and the characteristic parameters, comprises:

constructing a virtual grounding resistance equation according to the characteristic parameters;

obtaining the virtual grounding resistance by solving the virtual grounding resistance equation according to the characteristic frequency.

7. The method for a pilot directional protection of LCC-HVDC lines based on virtual grounding resistance according to claim 1, wherein determining the fault areas according to the virtual grounding resistance, comprises:

determining whether the virtual grounding resistance is larger than the threshold value;

determining that a fault occurs in the DC line area when the virtual grounding resistance is less than the threshold value; and determining that a fault occurs outside the DC line area when the virtual grounding resistance is not less than the threshold value.

\*      \*      \*      \*      \*